(12) United States Patent
Yonemura et al.

(10) Patent No.: US 9,385,299 B2
(45) Date of Patent: Jul. 5, 2016

(54) LIQUID EJECTING HEAD, LIQUID EJECTING APPARATUS, AND PIEZOELECTRIC ELEMENT

(71) Applicant: SEIKO EPSON CORPORATION, Tokyo (JP)

(72) Inventors: Takayuki Yonemura, Suwa (JP); Masahisa Nawano, Suwa (JP); Akio Konishi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/550,308

(22) Filed: Nov. 21, 2014

(65) Prior Publication Data

US 2015/0145926 A1 May 28, 2015

(30) Foreign Application Priority Data

Nov. 22, 2013 (JP) ................. 2013-242389

(51) Int. Cl.
| | | |
|---|---|---|
| *B41J 2/045* | (2006.01) | |
| *H01L 41/09* | (2006.01) | |
| *H01L 41/187* | (2006.01) | |
| *B41J 2/14* | (2006.01) | |

(52) U.S. Cl.
CPC ......... *H01L 41/0973* (2013.01); *B41J 2/14233* (2013.01); *H01L 41/1878* (2013.01); *B41J 2202/03* (2013.01)

(58) Field of Classification Search
None
See application file for complete search history.

(56) References Cited

U.S. PATENT DOCUMENTS

| | | | |
|---|---|---|---|
| 2011/0012963 A1 | 1/2011 | Miyazawa et al. | |
| 2011/0164095 A1 | 7/2011 | Nawano et al. | |
| 2011/0228014 A1* | 9/2011 | Takahashi | 347/68 |
| 2012/0182361 A1 | 7/2012 | Miyazawa et al. | |
| 2012/0200643 A1* | 8/2012 | Isshiki | 347/72 |
| 2013/0101731 A1 | 4/2013 | Yonemura et al. | |

FOREIGN PATENT DOCUMENTS

| | | |
|---|---|---|
| JP | 55-017589 | 2/1980 |
| JP | 2001-223404 | 8/2001 |
| JP | 2009-252789 | 10/2009 |
| JP | 2011-020385 | 2/2011 |
| JP | 2011-142143 | 7/2011 |
| JP | 2012-151308 | 8/2012 |
| JP | 2012-156160 | 8/2012 |
| JP | 2013-102113 | 5/2013 |
| JP | 5408192 | 2/2014 |

* cited by examiner

*Primary Examiner* — Erica Lin
(74) *Attorney, Agent, or Firm* — Workman Nydegger

(57) ABSTRACT

Provided is a piezoelectric element comprising a first electrode; a piezoelectric body layer provided on the first electrode, the piezoelectric body layer including 50 mol % or more of at least bismuth and iron, and the piezoelectric body layer having a current density-time curve obtained by applying a voltage to the first electrode and the second electrode including a plurality of inflection points; and a second electrode provided on the piezoelectric body layer.

11 Claims, 12 Drawing Sheets

EXAMPLE

COMPARATIVE EXAMPLE

LIQUID EJECTING HEAD, LIQUID EJECTING APPARATUS, AND PIEZOELECTRIC ELEMENT

BACKGROUND

1. Technical Field

The present invention relates to a liquid ejecting head including a piezoelectric element that has an electrode which causes a pressure change in a pressure generation chamber that is in communication with a nozzle opening, and a piezoelectric body layer, a liquid ejecting apparatus, and a piezoelectric element.

2. Related Art

High piezoelectric characteristics are sought after in piezoelectric materials that are used as piezoelectric body layers that configure liquid ejecting heads, and it is possible to include lead zirconate titanate (PZT) as a representative example of a piezoelectric material (for example, refer to JP-A-2001-223404). However, from an environmental perspective, non-lead piezoelectric materials and piezoelectric materials with reduced lead contents are desirable. For example, $BiFeO_3$-based piezoelectric materials that include bismuth and iron are examples of piezoelectric materials that do not contain lead. A composite oxide that is represented as mixed crystals of bismuth manganate ferrate $(Bi(Fe, Mn)O_3)$ and barium titanate $(BaTiO_3)$ is a specific example thereof (for example, refer to JP-A-2009-252789).

In addition, in order to perform high-quality printing, as a drive waveform that is used in an ink jet type recording head, it is possible to reduce the weight of ink droplets that are discharged, and to reduce a recording dot diameter by performing so-called "pull-striking", which causes a pressure generation chamber in which ink is accommodated to contract after causing the pressure generation chamber to expand (for example, refer to JP-A-55-17589).

In an ink jet type recording head that uses deflection displacement type piezoelectric vibrations, in order to perform the aforementioned "pull-striking", an intermediate voltage $V_m$ is set as a base point, and a drive waveform that includes a first signal for expanding a pressure generation chamber, a second signal for contracting the pressure generation chamber in order to discharge ink, and a third signal for reverting a contracted pressure generation chamber to the original state thereof after ink discharge, is used. Therefore, during non-driving the DC voltage of the intermediate voltage $V_m$ is in a state of being applied to a piezoelectric body.

Since the aforementioned PZT has a high insulating property, up until now, the intermediate voltage $V_m$ was not a problem. In this manner, the reason why PZT has an insulating property that is sufficiently high for the $V_m$ not to become a problem is that PZT is a band insulating body that has a wide band gap.

On the other hand, $BiFeO_3$ is Mott insulating body in which a band gap is generated by interactions between electrons of the 3d orbital (on-site Coulomb interaction). Therefore, in $BiFeO_3$-based piezoelectric materials, as disclosed in JP-A-2009-252789, a countermeasure that reduces the amount of leakage current by adding Mn, the degree of freedom of d electrons and valence of which is high, as an additive has been adopted.

However, in countermeasures to reduce the amount of leakage current, since Mn also forms an impurity level at the same time it is not possible to realize an insulating property that is common to PZT. From this kind of circumstance, in order to use a $BiFeO_3$-based piezoelectric material as a piezoelectric material of a liquid ejecting head that is as reliable as or more reliable than PZT, in addition to improving the insulation property it is necessary to improve the resistance property to DC voltage.

SUMMARY

An advantage of some aspects of the invention is to provide a liquid ejecting head including a piezoelectric element that has an improved breakage resistance property to DC voltage in a piezoelectric material that includes bismuth and iron, a liquid ejecting apparatus, and a piezoelectric element.

According to an aspect of the invention, there is provided a piezoelectric element comprising a first electrode, a piezoelectric body layer provided on the first electrode, and a second electrode provided on the piezoelectric body layer. The piezoelectric body layer includes 50 mol % or more of at least bismuth and iron. A current density-time curve of the piezoelectric body layer that is obtained by applying a voltage to the first electrode and the second electrode has two or more inflection points. In this case, an impurity level (a sub-band) with a small carrier concentration that is excited by direct current conduction is incorporated in the current density-time curve of the piezoelectric body layer. Since the excitation time thereof is slow, the impurities with a small carrier concentration can make a dielectric relaxation time of the piezoelectric body layer longer by competing with dielectric relaxation. As a result of this configuration, it is possible to improve the breakage resistance property to DC voltage without a dramatic improvement in insulating property.

In this instance, one of the plurality of inflection points may be convex upwards with respect to an absolute value of an amount of a current. In this case, since the amount of the current initially increases with the passage of time, it is possible to make the dielectric relaxation time of the piezoelectric body layer longer, and therefore, it is possible to improve the breakage resistance property to DC voltage.

In this instance, one of the plurality of inflection points may be convex downwards with respect to an absolute value of an amount of a current. In this case, since the excitation of the impurities with a small carrier concentration and dielectric relaxation compete with one another, it is possible to reliably make the dielectric relaxation time of the piezoelectric body layer longer.

In this instance, the plurality of inflection points may be includes a first inflection point which is convex downwards with respect to an absolute value of an amount of a current and a second inflection point which is convex downwards with respect to an absolute value of an amount of a current. In this case, it is possible to improve the breakage resistance property to DC voltage and reliably make the dielectric relaxation time of the piezoelectric body layer longer, as described above. An absolute value of an amount of a current at the first inflection point may be greater than or equal to an absolute value of an amount of a current at the second inflection point. In this case, it is possible to reliably slow down the excitation time of the impurities with a small carrier concentration, and therefore, it is possible to make the dielectric relaxation time of the piezoelectric body layer longer still.

In addition, the piezoelectric body layer may be formed by firing films including at least bismuth and iron, in a nitrogen atmosphere. In this case, it is possible to introduce impurities with a small carrier concentration into the piezoelectric body layer in a relatively easy manner, and therefore, it is possible to incorporate a sub-band in the current density-time curve of the piezoelectric body layer.

In addition, it is preferable that the piezoelectric body layer further includes barium and titanium. In this case, it is possible to further improve the breakage resistance property to DC voltage.

In addition, it is preferable that the piezoelectric body layer further includes manganese. In this case, it is possible to suppress a leakage current, and it is possible to reliably improve the breakage resistance property to DC voltage.

According to another aspect of the invention, there is provided a liquid ejecting head including the piezoelectric element according to any one of the abovementioned aspects, and is provided a liquid ejecting apparatus including the liquid ejecting head. In this case, a liquid ejecting head and a liquid ejecting apparatus including a piezoelectric element in which it is possible to improve the breakage resistance property to DC voltage without a dramatic improvement in insulating property, is realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
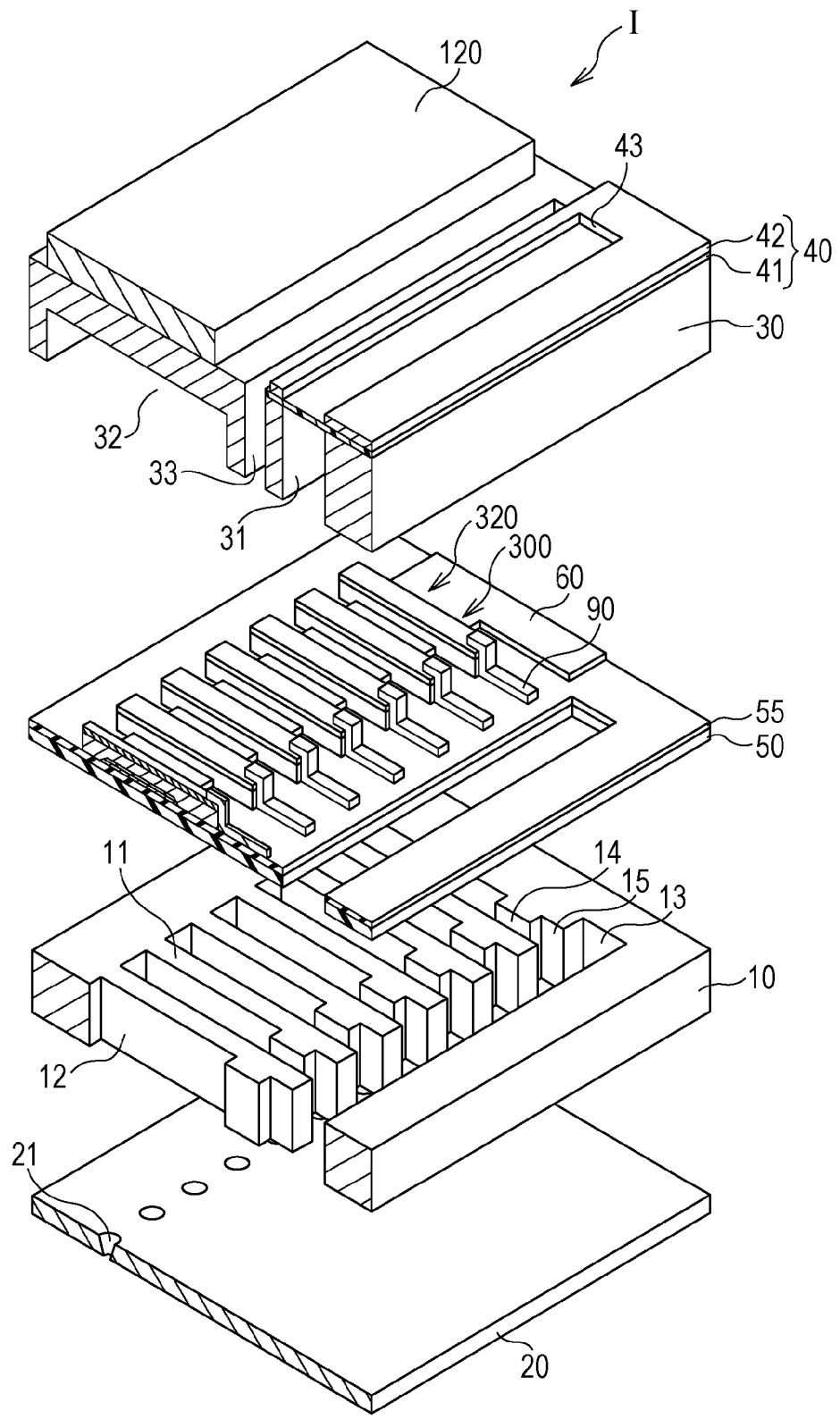
FIG. 1 is an exploded perspective view that shows a schematic configuration of a recording head according to Embodiment 1.
Figure 2:
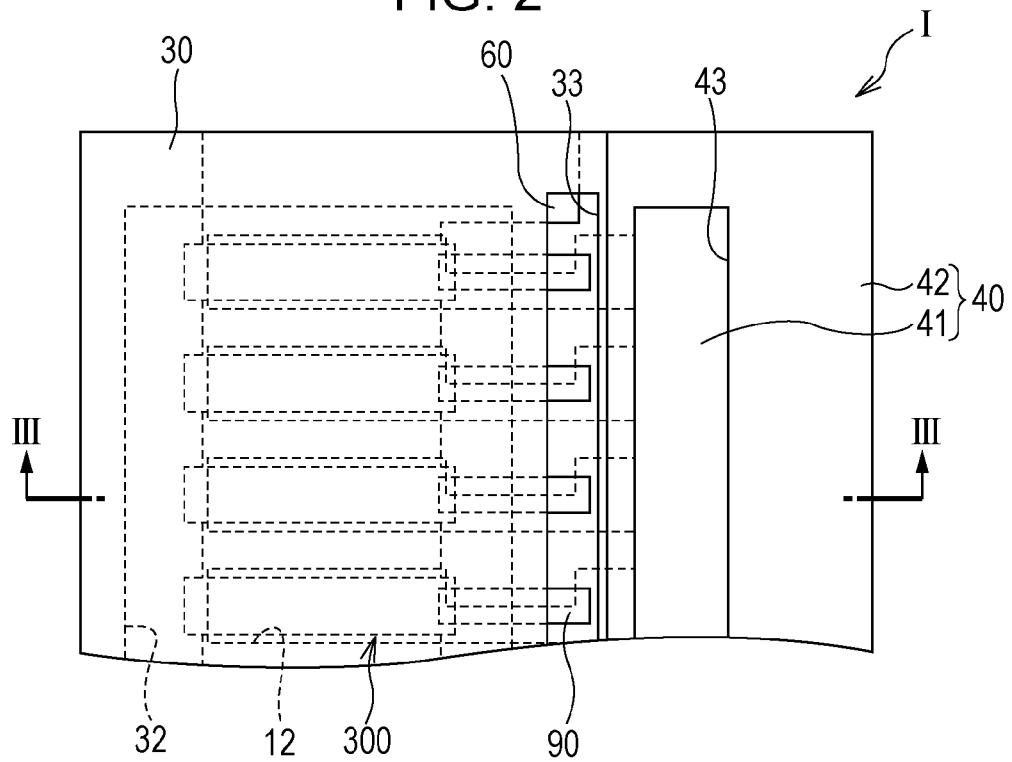
FIG. 2 is a plan view of the recording head according to Embodiment 1.
Figure 3:
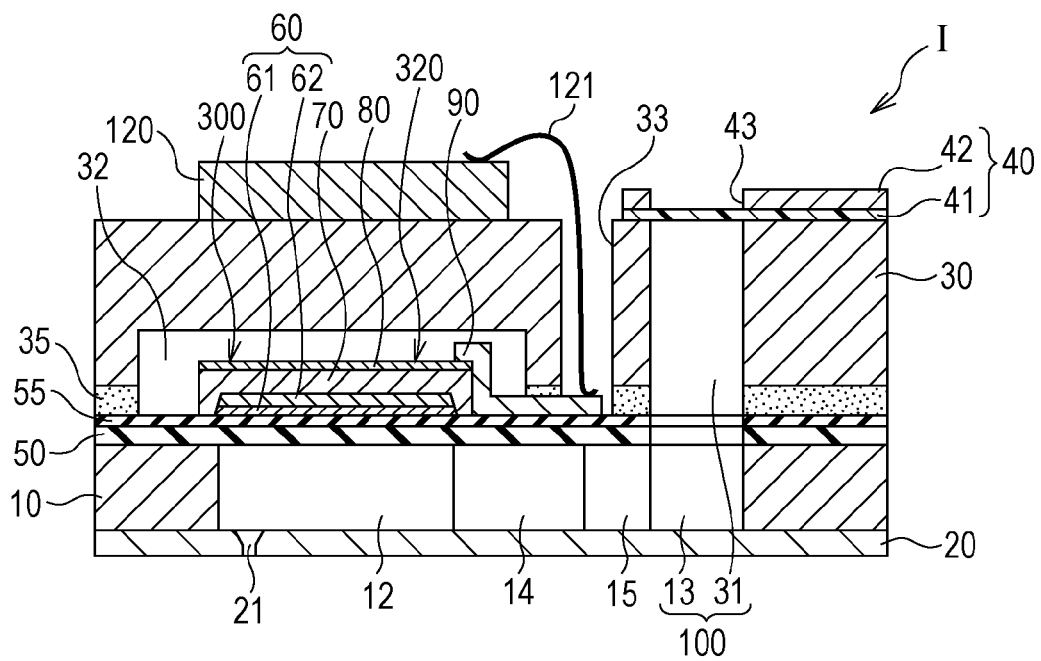
FIG. 3 is a cross-sectional view of the recording head according to Embodiment 1.

FIG. 1 is an exploded perspective view that shows a schematic configuration of an ink jet type recording head, which is an example of a liquid ejecting head according to Embodiment 1 of the invention, FIG. 2 is a plan view of FIG. 1, and FIG. 3 is a cross-sectional view of a line III-III in FIG. 2. As shown in FIGS. 1 to 3, a flow path forming substrate 10 of the present embodiment is made of a silicon single crystalline substrate, and an elastic film 50 that is formed from silicon dioxide is formed on a surface thereof.

A plurality of pressure generation chambers 12 are arranged in parallel on the flow path forming substrate 10 in a width direction thereof. In addition, a communication portion 13 is formed in a region on an external side in a longitudinal direction of the pressure generation chambers 12 of the flow path forming substrate 10, and the communication portion 13 and the pressure generation chambers 12 are in communication with one another through ink supply paths 14 and communication paths 15 that are provided for each pressure generation chamber 12. The communication portion 13 configures a portion of a manifold that forms an ink chamber that is common to each of the pressure generation chambers 12 by being in communication with a manifold portion 31 of a protective substrate that will be described later. The ink supply paths 14 are formed with a width that is narrower than that of the pressure generation chambers 12, and retains a flow path resistance of ink that flows into the pressure generation chambers 12 from the communication portion 13 as a constant. Additionally, in the present embodiment, the ink supply paths 14 are formed by squeezing the widths of the flow paths from one side, but the ink supply paths may be formed by squeezing the widths of the flow paths from both sides. In addition, instead of squeezing the widths of the flow paths, the ink supply paths may be formed by squeezing the flow path from a thickness direction. In the present embodiment, a liquid flow path that is formed from the pressure generation chambers 12, the communication portion 13, the ink supply paths 14 and the communication paths 15 is provided in the flow path forming substrate 10.

In addition, a nozzle plate 20, in which nozzle openings 21 that are in communication with the vicinity of an end portion of each pressure generation chamber 12 on a side thereof that is opposite to the ink supply paths 14 are drilled, is fixed to a side of an open surface of the flow path forming substrate 10 using an adhesive, a thermal welding film or the like. Additionally, the nozzle plate 20 is, for example, formed from a glass ceramic, a silicon single crystalline substrate, a stainless steel or the like.

Meanwhile, as mentioned above, the elastic film 50, that is formed from silicon dioxide and, for example, has a thickness of approximately 0.5 μm to 1.0 μm, is formed on a side of the flow path forming substrate 10 that is opposite to the open surface, an insulating body layer 55 that is, for example, formed from zirconium oxide ($ZrO_2$) is formed using lamination on the elastic film 50. Additionally, according to necessity, an adhesive layer with a thickness of for example, 10 to 30 nm may be provided on the insulating body layer 55. It is possible to include titanium, zirconium or an oxide thereof as an example of the adhesive layer.

Furthermore, a first electrode 60, a piezoelectric body layer 70 which is a thin film with a thickness of 3 μm or less, or preferably 0.3 to 1.5 μm, and a second electrode 80 are formed using lamination on the insulating body layer 55, and configure a piezoelectric element 300 as pressure generation means that cause a pressure change in the pressure generation chambers 12. In this instance, the piezoelectric element 300 refers to a portion that includes the first electrode 60, the piezoelectric body layer 70, and the second electrode 80. Generally, one electrode of the piezoelectric element 300 is set as a common electrode, and the other electrode thereof and the piezoelectric body layer 70 are patterned and configured for each pressure generation chamber 12. In the present embodiment, the first electrode 60 is set as a common electrode of the piezoelectric element 300 and the second electrode 80 is set as an individual electrode of the piezoelectric element 300, but this configuration may be reversed for the convenience of a drive circuit or wiring. In addition, in this instance, the piezoelectric element 300 and a vibration plate that causes displacement by driving the piezoelectric element 300 are collectively referred to as an actuator device. Additionally, in the embodiment that is mentioned above, the elastic film 50, the insulating body layer 55, the first electrode 60 and the adhesive layer that is provided according to necessity act as the vibration plate, but, naturally, the configuration is not limited to this and, for example, a configuration in which the elastic film 50 and the insulating body layer 55 are not provided may be used. In addition, a configuration in which the piezoelectric element 300 itself also effectively doubles as the vibration plate may be used. However, in a case in which the first electrode 60 is directly provided on the flow path forming substrate 10, it is preferable to protect the first electrode 60 with an insulating protective film or the like so that there is no conduction between the first electrode 60 and ink.

In this instance, as shown in FIG. 3, the first electrode 60 of the present embodiment is for example, configured from two layers of a wiring layer 61 that is formed from platinum, and a lanthanum nickel oxide layer (an LNO layer) 62 that is formed on the wiring layer 61.

More specifically, the lanthanum nickel oxide layer 62 is formed using a composition for lanthanum nickel oxide film formation that is obtained by heating a mixed solution after obtaining the mixed solution by mixing lanthanum acetate, nickel acetate and propionic acid. In the lanthanum nickel oxide layer 62, the orientation surface of crystals is preferentially oriented (naturally oriented) to an (001) surface or an (100) surface. As a result of this configuration, it is possible to preferentially orient the piezoelectric body layer 70 that is provided on the lanthanum nickel oxide layer 62 to an (001) surface or an (100) surface. It is possible to include $LaNiO_3$, $La_3Ni_2O_6$, $LaNiO_2$, $La_2NiO_4$, $La_3Ni_2O_7$, $La_4Ni_3O_{10}$ and the like as examples of the lanthanum nickel oxide. Additionally, the lanthanum nickel oxide layer 62 may be formed by a chemical solution method that uses a different composition for lanthanum nickel oxide film formation, and may form a film using a gas phase method such as a sputtering method.

In addition, in the present embodiment, the wiring layer 61 is set as a platinum layer that is formed from platinum, but is not limited to this configuration, and for example, it is possible to include a laminated structure of an iridium oxide layer that includes iridium and iridium oxide, a platinum layer and an iridium oxide layer. The thickness of the wiring layer 61 is not particularly limited, but for example, may be set as approximately 10 to 300 nm. In addition, the thickness of the lanthanum nickel oxide layer 62 is not particularly limited, but for example, may be set as approximately 10 to 100 nm. This kind of first electrode 60 that is configured by the wiring layer 61 and the lanthanum nickel oxide layer 62 need not necessarily have a laminated structure, and for example, a single layer that is formed from platinum may be used as the wiring layer 61.

The piezoelectric body layer 70 according to the invention is formed from a composite oxide having a perovskite structure that includes 50 mol % or more of at least bismuth (Bi) and iron (Fe). In the present embodiment, a composite oxide having a perovskite structure that further includes Ba and Ti is set as the piezoelectric body layer 70. The piezoelectric body layer 70 has a perovskite structure, that is, an $ABO_3$ type structure in which an A site is in 12-fold coordination surrounded by a cuboctahedron of oxygen atoms and a B site is in 6-fold coordination surrounded by an octahedron of oxygen atoms. Bi and Ba are included at the A site of the perovskite structure and Fe and Ti are included at the B site.

This kind of piezoelectric body layer 70, that is, a composite oxide having a perovskite structure that includes 50 mol % or more of at least Bi and Fe and further includes Ba and Ti, is expressed as a composite oxide having a perovskite structure of mixed crystal of bismuth ferrite and barium titanate, or as a solid solution in which bismuth ferrite and barium titanate are uniformly dispersed.

In this instance, bismuth ferrite and barium titanate are both known piezoelectric materials that have a perovskite structure, and various respective compositions thereof are known. For example, in addition to $BiFeO_3$ and $BaTiO_3$, materials in which a portion of an element is lost or in excess, or in which a portion of an element is substituted with another element are also known as bismuth ferrite and barium titanate, but in the invention, in cases in which bismuth ferrite and barium titanate are written, unless the basic characteristics are changed, materials which deviate from the stoichiometric composition due to a loss or a surplus, or in which a portion of an element is substituted with another element are also included in the ranges of bismuth ferrite and barium titanate.

The composition of this kind of piezoelectric body layer 70 that is formed from a composite oxide that has a perovskite structure is expressed using $((Bi, Ba) (Fe, Ti)O_3)$. As a representative example, the composition is expressed as the mixed crystal as expressed in the general formula (1) mentioned below. In addition, the formula (1) can also be expressed using the general formula (1') mentioned below. In this instance, the descriptions of the general formula (1) and the general formula (1') are compositional notations that are based on stoichiometry, and as mentioned above, in addition to inevitable changes in composition due to lattice mismatching, oxygen deficiency and the like, partial substitution of an element or the like is also allowed within a range in which a perovskite structure can be understood. For example, if a stoichiometric ratio is set as 1, a value within a range of 0.85 to 1.20 is allowed.

$$(1-x)[BiFeO_3]-x[BaTiO_3] \quad (1)$$

$(0<x<0.40)$

$$(Bi_{1-x}Ba_x)(Fe_{1-x}Ti_x)O_3 \quad (1')$$

$(0<x<0.40)$

In this instance, the bismuth ferrite ($BiFeO_3$) that configures the piezoelectric body layer 70 is a Mott insulating body in which a band gap is generated by interactions between electrons of the 3d orbital (on-site Coulomb interaction), and a $3d^5$ state of $Fe^{3+}$ ions that forms the band gap has a competitive relationship with a $3d^4$ state of $Fe^{2+}$ ions. Therefore, since a portion of the Fe in a composite oxide that includes lattice defects, exists as $Fe^{2+}$ ions, the insulating property thereof is broken, and generates a leakage current. In addition to the bismuth ferrite that includes Bi and Fe, this kind of leakage mechanism is also generated in the piezoelectric body layer of the present embodiment, that is a mixed crystal of bismuth ferrite and barium titanate or a solid solution in which bismuth ferrite and barium titanate are uniformly dispersed. Therefore, it is possible to reduce the amount of leakage current by adding Mn, Co, Cr or the like, the degree of freedom of d electrons and valence of which is high, as additives, to the piezoelectric body layer 70.

In a case in which the piezoelectric body layer 70 includes Mn, Co or Cr, a composite oxide with a structure in which the Mn, Co or Cr is positioned at the B site is used. For example, in a case in which the piezoelectric body layer includes Mn, a composite oxide that configures the piezoelectric body layer 70 is represented as a composite oxide that has a structure in which a portion of the Fe of a solid solution in which bismuth ferrite and barium titanate are uniformly dispersed is substituted with Mn, or a perovskite structure of a mixed crystal of bismuth manganate ferrate and barium titanate, and the basic characteristics thereof are the same as a composite oxide that has a perovskite structure of a mixed crystal of bismuth ferrite and barium titanate. In addition, in a case in which the piezoelectric body layer 70 includes Co or Cr, it is possible to improve the leakage characteristics in the same manner as with Mn. Additionally, in an X-ray diffraction pattern, bismuth ferrite, barium titanate, bismuth manganate ferrate, bismuth cobaltate ferrate and bismuth chromate ferrate are not detected alone. In addition, the piezoelectric body layer 70 has been described using Mn, Co and Cr as examples, but it is known that leakage characteristics are improved in the same manner in cases in which two other transition metal elements are simultaneously included, it is also possible to set these elements as the piezoelectric body layer 70, and other publically-known additives may be included in order to improve characteristics. Additionally, in a case of a composite oxide that includes Mn, Co or Cr, it is also preferable that the composite oxide have a perovskite structure.

In this instance, the composition of a piezoelectric body layer 70 that includes Mn, Co or Cr in addition to Bi, Fe and Ba is expressed using $((Bi, Ba)(Fe, Ti, Mn, Co, Cr)O_3)$. As a representative example, the composition is expressed as the mixed crystal as expressed in the general formula (2) mentioned below. In addition, the formula (2) can also be expressed using the general formula (2') mentioned below. Furthermore, in the general formula (2) and the general formula (2'), M is the Mn, Co or Cr. In this instance, the descriptions of the general formula (2) and the general formula (2') are compositional notations that are based on stoichiometry, and as mentioned above, inevitable changes in composition due to lattice mismatching oxygen deficiency and the like are allowed within a range in which a perovskite structure can be understood. For example, if a stoichiometric ratio is 1, a value within a range of 0.85 to 1.20 is allowed. In addition, in the manner that will be described below, there are cases in which composite oxides in which the ratios of the elements of the A site and the elements of the B site are the same, are treated as the same composite oxide even if different when expressed in a general formula.

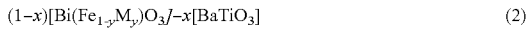

$(1-x)[Bi(Fe_{1-y}M_y)O_3]-x[BaTiO_3]$ (2)

$(0<x<0.40, 0.01<y<0.10)$

$(Bi_{1-x}Ba_x)((Fe_{1-y}M_y)_{1-x}Ti_x)O_3$ (2')

$(0<x<0.40, 0.01<y<0.10)$

In this manner, it is possible to improve the leakage characteristics in the piezoelectric body layer 70 that is represented by $((Bi, Ba)(Fe, Ti, Mn, Co, Cr)O_3)$ by adding Mn, Co or Cr. However, since Mn, Co and Cr form an impurity level simultaneously, it is necessary to further improve the breakage resistance property to DC voltage.

In the invention, the breakage resistance property to DC voltage is improved by incorporating an impurity level (a sub-band) with a small carrier concentration that is excited by direct current conduction in a current density-time curve of the piezoelectric body layer 70. As a result of the incorporation of this kind of sub-band, the current density-time curve of the piezoelectric body layer 70 has two or more inflection points. More specifically, it is possible to form the piezoelectric body layer 70 that has two or more inflection points by, for example, forming an oxide layer 72 (refer to FIG. 5C) that is formed from a composite oxide that includes Bi, Fe, Ba and Ti using a liquid phase method, and firing in a nitrogen atmosphere, firing in a pressurized nitrogen atmosphere, firing in an inert gas, firing in a pressurized inert gas atmosphere or the like.

In the present embodiment, the piezoelectric body layer 70 that has a current density-time curve with two or more inflection points is formed by firing the oxide layer 72 in a pressurized nitrogen atmosphere, and introducing impurities with a small carrier concentration into the piezoelectric body layer 70. A current density-time curve of the piezoelectric body layer 70 has two inflection points of an inflection point that is caused by the incorporation of a sub-band (set as a level 1), and an inflection point that is caused by normal dielectric relaxation (set as a level 2). More specifically, the current density-time curve has an inflection point (the level 1) that changes to a decrease after the amount of a current has initially increased to a maximum with the passage of time, and an inflection point (the level 2) that changes to an increase after the amount of the current has further decreased to a minimum with the passage of time. In these kinds of inflection points a first (the level 1) inflection point becomes convex upwards with respect to an absolute value of the amount of a current, and a second (the level 2) inflection point becomes convex downwards with respect to the absolute value of the amount of the current.

A current density-time curve of a normal piezoelectric body layer only has the inflection point (the level 2) that changes to an increase after the amount of a current has initially decreased to a minimum with the passage of time due to dielectric relaxation, and an inflection point (the level 1) such as that in the invention that is caused by the incorporation of a sub-band is not found. This kind of level 1 that is caused by the incorporation of a sub-band corresponds to an excitation level of impurities with a small carrier concentration that are introduced into the piezoelectric body layer 70. As shown in an example that will be described later, an excitation time of the impurities with a small carrier concentration is extremely slow in comparison with a dielectric relaxation time, that is, a time to reach the level 1 is longer than a time to reach the level 2. As a result of this configuration, the excitation of the impurities with a small carrier concentration and dielectric relaxation compete with one another, it is possible to make a dielectric relaxation time of the piezoelectric body layer 70 longer, and therefore, it is possible to improve the breakage resistance property to DC voltage.

Additionally, in the current density-time curve of the piezoelectric body layer 70, it is preferable that the absolute value of the amount of the current at the first inflection point be greater than or equal to the absolute value of the amount of the current at the second inflection point. According to this configuration, it is possible to reliably slow down the excitation time of the impurities with a small carrier concentration, and therefore, it is possible to make the dielectric relaxation time of the piezoelectric body layer longer still.

This kind of piezoelectric body layer 70 will be described in detail later, but it is possible to form the piezoelectric body layer 70 with a liquid phase method such as a sol-gel method or an MOD (Metal-Organic Decomposition) method, or a PVD (Physical Vapor Deposition) method (a gas phase method) such as a sputtering method or a laser ablation method.

Lead electrodes 90 that, for example, are formed from gold (Au) or the like, and are drawn out from the vicinity of an end portion of a side of each ink supply path 14 and provided to extend onto the elastic film 50 and the insulating body layer 55, are connected to each second electrode 80, which are individual electrodes. In addition, according to necessity, the piezoelectric element 300 includes a protective film as an insulating body which is not shown in the drawings. In a case in which the protective film is provided, the protective film covers at least the piezoelectric body layer 70. It is possible to include an inorganic insulating material such as aluminum oxide ($AlO_x$) as the protective film.

A protective substrate 30 that has the manifold portion 31 that configures at least a portion of a manifold 100 is bonded onto the flow path forming substrate 10 on which the piezoelectric element 300 is formed, that is, onto the first electrode 60, the elastic film 50, the insulating body layer 55, and the lead electrodes 90 using an adhesive 35. In the present embodiment, the manifold portion 31 is formed across the entire width direction of the pressure generation chambers 12 by penetrating the protective substrate 30 in the thickness direction, and configures the manifold 100 that forms an ink chamber that is common to each of the pressure generation chambers 12 by being in communication with the communication portion 13 of the flow path forming substrate 10 as mentioned above. In addition, a configuration in which only the manifold portion 31 is used as the manifold may be set by dividing the communication portion 13 of the flow path forming substrate 10 into a plurality of portions for each pressure generation chamber 12. Furthermore, for example, a configuration in which only the pressure generation chambers 12 are provided in the flow path forming substrate 10, and the ink supply paths 14, which are in communication with the manifold 100 and each pressure generation chamber 12, are provided in a member (for example, the elastic film 50 or the insulating body layer 55) interposed between the flow path forming substrate 10 and the protective substrate 30, may also be used.

In addition, a piezoelectric element retention portion 32 that has a space that is of an extent size that does not disturb the movement of the piezoelectric element 300 is provided in a region of the protective substrate 30 that is facing the piezoelectric element 300. It is suitable provided the piezoelectric element retention portion 32 has a space that is of an extent that does not disturb the movement of the piezoelectric element 300, and the space may be sealed or may not be sealed.

As this kind of protective substrate 30, it is preferable to use a material that has substantially the same coefficient of thermal expansion as that of the flow path forming substrate 10, for example, glass, a ceramic material or the like.

In addition, a through hole 33 that penetrates the protective substrate 30 in the thickness direction is formed in the protective substrate 30. Further, the vicinity of end portions of the lead electrodes 90 that are drawn out from each piezoelectric element 300 is provided so as to be exposed inside the through hole 33.

In addition, a drive circuit 120 for driving the piezoelectric elements 300 that are arranged in parallel is fixed onto the protective substrate 30. For example, it is possible to use a circuit board, a semiconductor integrated circuit (IC) or the like as the drive circuit 120. Further, the drive circuit 120 and the lead electrode 90 are electrically connected to one another via connection wiring 121 that is formed from conductive wire such as bonding wire.

In addition, a compliance substrate 40 that is formed from a sealing film 41 and a fixing plate 42 is bonded onto the protective substrate 30. In this instance, the sealing film 41 is formed from a flexible material with low rigidity, and a surface of the manifold portion 31 is sealed using the sealing film 41. In addition, the fixing plate 42 is formed with a relatively hard material. Since a region of the fixing plate 42 that faces to the manifold 100 is an open portion 43 that is formed by completely removing the plate that corresponds to the region in the thickness direction, the surface of the manifold 100 is sealed by the flexible sealing film 41 only.

In an ink jet type recording head I of the present embodiment, ink is taken up from an ink introduction port that is connected to external ink supplying means that is not shown in the drawings, a voltage is respectively applied between the first electrode 60 and second electrode 80 that correspond to the pressure generation chambers 12 depending on a recording signal from the drive circuit 120 after the inside from the manifold 100 to the nozzle opening 21 is filled with ink, the pressure in each pressure generation chamber 12 increases due to the elastic film 50, the insulating body layer 55, the first electrode 60 and the piezoelectric body layer 70 being bent and deformed, and ink droplets are discharged from the nozzle openings 21.

Next, an example of a manufacturing method of the ink jet type recording head of the present embodiment will be described with reference to FIGS. 4A to 8B. Additionally, FIGS. 4A to 8B are cross-sectional views of a pressure generation chamber in a longitudinal direction. In the present embodiment, an example of a case in which a composite oxide that has a perovskite structure that includes Bi, Fe, Ba and Ti is formed as the piezoelectric body layer 70 is shown. The composite oxide (the piezoelectric body layer 70) is configured by a 10-layer piezoelectric body film 73.

Figure 4A:
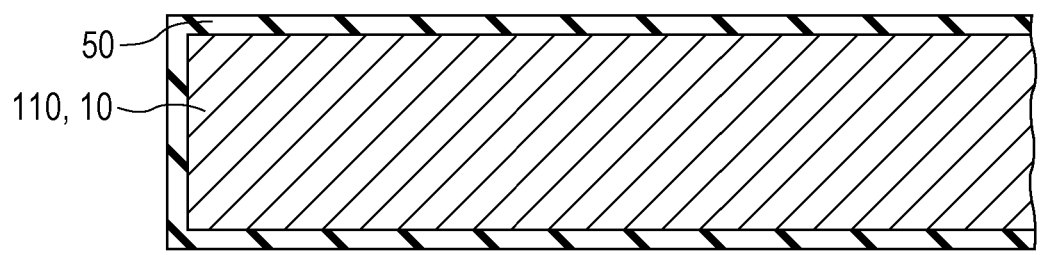
FIGS. 4A and 4B are cross-sectional views that show a manufacturing process of the recording head according to Embodiment 1.
Figure 4B:
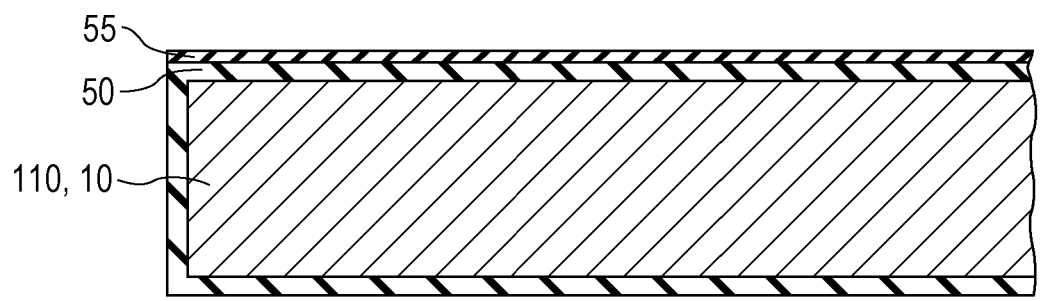

Firstly, as shown in FIG. 4A, a silicon dioxide film that is formed from silicon dioxide ($SiO_2$) or the like that configures the elastic film 50 is formed on a surface of a wafer for the flow path forming substrate, which is a silicon wafer. Next, as shown in FIG. 4B, the insulating body layer 55 that is formed from zirconium oxide is formed on the elastic film 50 (the silicon dioxide film).

Figure 5A:
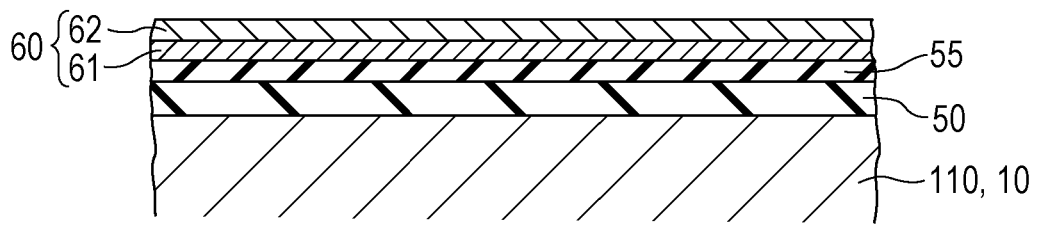
FIGS. 5A to 5C are cross-sectional views that show a manufacturing process of the recording head according to Embodiment 1.
Figure 5B:
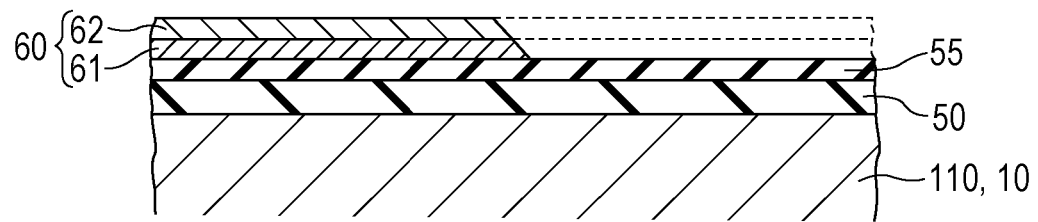

Next, as shown in FIG. 5A, the first electrode 60 is formed by forming the wiring layer 61 that is formed from platinum, iridium, iridium oxide or a laminated structure thereof over the entire surface of the insulating body layer 55 using a sputtering method, a vapor deposition method or the like, and further forming the lanthanum nickel oxide (LNO) layer 62 on the wiring layer 61 using a sputtering method, a vapor deposition method, a chemical solution method or the like. Next, as shown in FIG. 5B, a resist of a predetermined shape (not shown in the drawings) is masked onto the first electrode 60, and simultaneously patterned so that a side surface of the first electrode 60 is inclined.

Next, after peeling off the resist, the piezoelectric body layer 70 is laminated on the first electrode 60. The method for manufacturing the piezoelectric body layer 70 is not limited, but for example, it is possible to manufacture the piezoelectric body layer 70 using a chemical solution method such as an MOD (Metal-Organic Decomposition) method or a sol-gel method that obtains a piezoelectric body layer (a piezoelectric body film) that is formed from a metal oxide by coating and drying a solution that includes metal complexes, and firing the solution at a high temperature. In addition, it is also possible to manufacture the piezoelectric body layer 70 with a gas phase method, a liquid phase method or a solid phase method such as a laser ablation method, a sputtering method, a pulse-laser-deposition method (a PLD method), a CVD method, or an aerosol-deposition method.

Figure 5C:
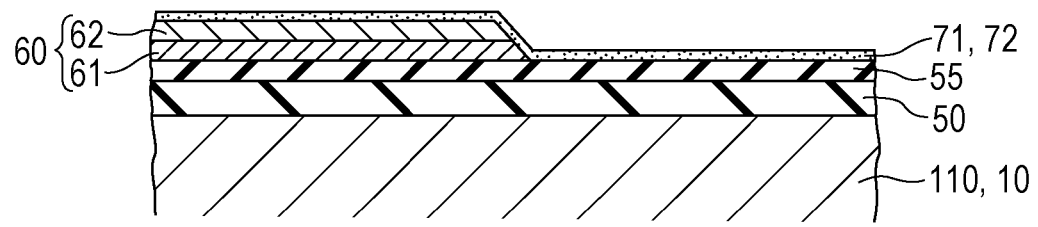

As an example of a specific formation sequence of a case in which the piezoelectric body layer 70 is formed with a chemical solution method, firstly, as shown in FIG. 5C, a piezoelectric body precursor film 71 is formed by coating a composition for piezoelectric body film formation (a precursor solution), which is formed from an MOD solution or a sol that contains metal complexes, or more specifically, contains Bi, Fe, Ba and Ti, onto the first electrode 60 using a spin coating method or the like (a coating process).

The precursor solution that is coated onto the first electrode 60 is a solution in which metal complexes that is capable of forming a composite oxide that includes Bi, Fe, Ba and Ti are mixed by firing, and the mixed product is dissolved or dispersed in an organic solvent. In addition, in a case in which a piezoelectric body layer 70 is formed from a composite oxide that includes Mn or Co, a precursor solution that contains metal complexes that further include Mn or Co is used. A mixing rate of metal complexes that respectively include Bi, Fe, Ba and Ti or a metal complexes that include Mn or Co mixed in according to necessity can be any rate at which each metal attains a predetermined molar ratio. For example, it is possible to use an alkoxide, an organic acid salt, a β-diketone complex or the like as metal complexes that respectively include Bi, Fe, Ba, Ti, Mn and Co. For example, it is possible to include bismuth 2-ethyl hexanoate, bismuth acetate or the like as examples of a metal complex that includes Bi. For example, it is possible to include iron 2-ethyl hexanoate, iron acetate, tris(acetylacetonato)iron or the like as examples of a metal complex that includes Fe. For example, it is possible to include barium isopropoxide, barium 2-ethyl hexanoate, acetylacetonato barium or the like as examples of a metal complex that includes Ba. For example, it is possible to include titanium isopropoxide, titanium 2-ethyl hexanoate, (di-i-propoxide)bis(acetylacetonato) titanium or the like as examples of a metal complex that includes Ti. For example, it is possible to include manganese 2-ethyl hexanoate, manganese acetate or the like as examples of a metal complex that includes Mn. For example, it is possible to include cobalt 2-ethyl hexanoate, cobalt (III) acetylacetonato or the like as examples of a metal complex that includes Co. Naturally, a metal complex that includes two kinds or more of Bi, Fe, Ba, Ti and Mn or Co incorporated according to necessity, may be used. In addition, it is possible to include propanol, butanol, pentanol, hexanol, octanol, ethylene glycol, propylene glycol, octane, decane, cyclohexane, xylene, toluene, tetrahydrofuran, acetate, 2-ethyl hexanoate or the like as examples of solvents of the precursor solution.

Next, the piezoelectric body precursor film 71 is heated to a predetermined temperature (for example, 150 to 200° C.) and is dried for a fixed time (a drying process). Next, the dried piezoelectric body precursor film 71 is heated to a predetermined temperature (for example, 350 to 450° C.) and is kept for a fixed time to remove grease (a degreasing process). As a result of this, the piezoelectric body precursor film 71 forms the oxide layer 72. In this instance, the degreasing refers to disengaging organic components that are included in the piezoelectric body precursor film 71, for example, $NO_2$, $CO_2$, $H_2O$ or the like. The atmospheres of the drying process and the degreasing process are not limited, but the processes may be performed in air, in an oxygen atmosphere, or in an inert gas. Additionally, the oxide layer 72 may be formed by performing the coating process, the drying process and the degreasing process a plurality of times.

Figure 6A:
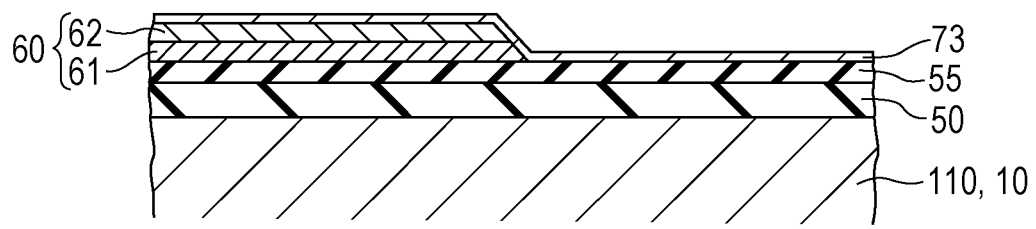
FIGS. 6A and 6B are cross-sectional views that show a manufacturing process of the recording head according to Embodiment 1.

Next, as shown in FIG. 6A, the oxide layer 72 is fired by heating to a predetermined temperature, for example, approximately 600 to 850° C., and retaining for a fixed time, for example, 1 to 10 minutes (a firing process). As a result of this, oxide layer 72 is crystallized, and the piezoelectric body film 73 that is formed from a composite oxide that has a perovskite structure that includes Bi, Fe, Ba and Ti is formed (the firing process). For example, it is possible to include an RTA (Rapid Thermal Annealing) device that heats using the irradiation of an infrared lamp, a hot plate or the like as a heating device that is used in the drying process, the degreasing process and the firing process.

In the invention, when the piezoelectric body film 73 is formed by firing the oxide layer 72, impurities with a small carrier concentration are introduced into the piezoelectric body film 73 by adjusting firing conditions such as the firing atmosphere and firing temperature of the firing process of the oxide layer 72. In the present embodiment, impurities with a small carrier concentration are introduced into the piezoelectric body film 73 by performing the firing process of the oxide layer 72 in a pressurized nitrogen atmosphere. As a result of this configuration, an impurity level (a sub-band) with a small carrier concentration is incorporated in a current density-time curve of the piezoelectric body film 73 (the piezoelectric body layer 70). As a result of the incorporation of this kind of sub-band, the current density-time curve of the piezoelectric body layer 70 becomes a current density-time curve that has a first (the level 1) inflection point that is convex upwards with respect to an absolute value of the amount of a current, and a second (the level 2) inflection point that is convex downwards with respect to the absolute value of the amount of the current. The first inflection point is an inflection point that is caused by the incorporation of the sub-band, and the second inflection point is an inflection point that is caused by normal dielectric relaxation. Since the excitation time of the impurities with a small carrier concentration that are introduced into the piezoelectric body layer 70 is extremely slow in comparison with a dielectric relaxation time, the excitation time can make the dielectric relaxation time of the piezoelectric body layer 70 longer by competing with dielectric relaxation. As a result of this, the piezoelectric body layer 70 in which the breakage resistance property to DC voltage is improved, is obtained.

Figure 6B:
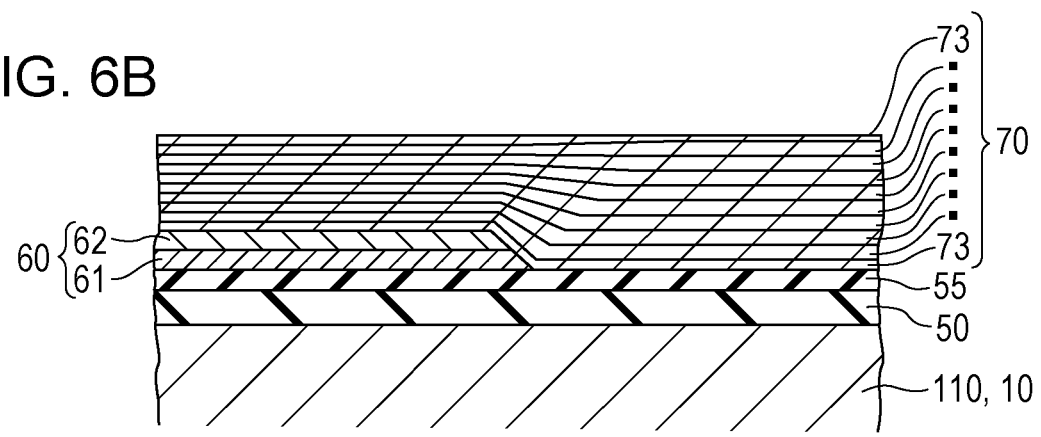

Next, as shown in FIG. 6B, the piezoelectric body layer 70 that is formed from a plurality of piezoelectric body films 73 is formed by repeating the coating process, the drying process and the degreasing process mentioned above or the coating process, the drying process, the degreasing process and the firing process a plurality of times depending on a desired film thickness to form the piezoelectric body layer 70 that is formed from a plurality of piezoelectric body films 73. For example, in a case in which the film thickness per application of coating solution is 0.1 μm, for example, the total thickness of the piezoelectric body layer 70 that is formed from a 10-layer piezoelectric body film 73 is approximately 1.0 μm. In the present embodiment, the piezoelectric body film 73 is provided by laminating 10 layers, but a configuration with only one layer, may also be used.

Figure 7A:
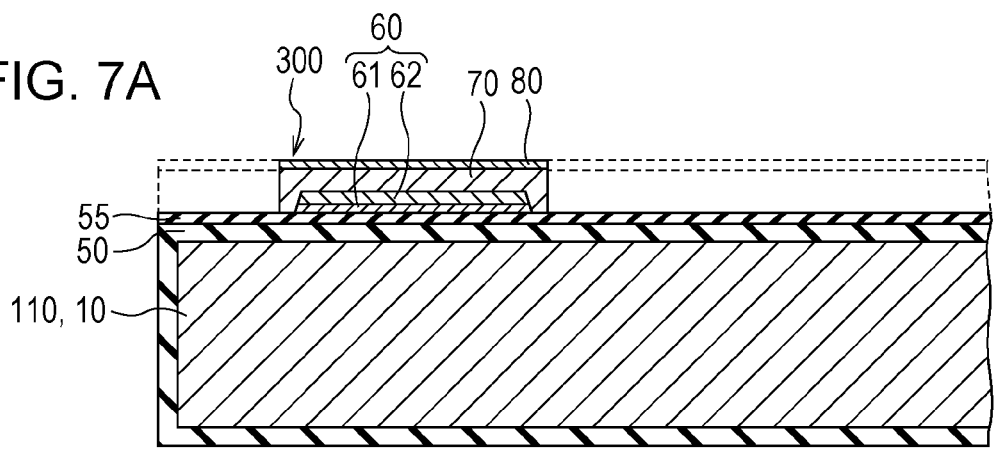
FIGS. 7A to 7C are cross-sectional views that show a manufacturing process of the recording head according to Embodiment 1.

After forming the piezoelectric body layer 70 in this manner, as shown in FIG. 7A, the piezoelectric element 300 that is formed from the first electrode 60, the piezoelectric body layer 70, and the second electrode 80 is formed by forming the second electrode 80 that is formed from platinum or the like on the piezoelectric body layer 70 using a sputtering method or the like, and simultaneously patterning the piezoelectric body layer 70 and the second electrode 80 in a region that faces each pressure generation chamber 12. Additionally, the patterning of the piezoelectric body layer 70 and the second electrode 80 can be performed in a lump by performing dry etching using a resist (not shown in the drawings) that is formed in a predetermined shape. Subsequently, according to necessity, annealing may be performed in a temperature range of 600 to 850° C., for example. As a result of this, it is possible to favorably form an interface between the piezoelectric body layer 70, the first electrode 60 and the second electrode 80, and therefore, it is possible to improve the crystal characteristics of the piezoelectric body layer 70.

Figure 7B:
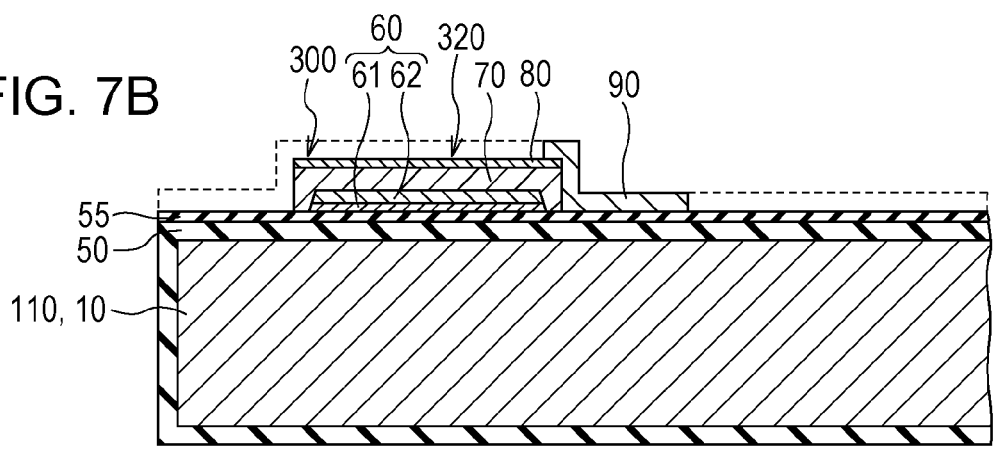

Next, as shown in FIG. 7B, after forming the lead electrode 90 that is formed from gold (Au) or the like, for example, over the entire surface of a flow path forming substrate wafer 110, for example, each piezoelectric element 300 is patterned using a mask pattern (not shown in the drawings) that is formed from a resist or the like.

Figure 7C:
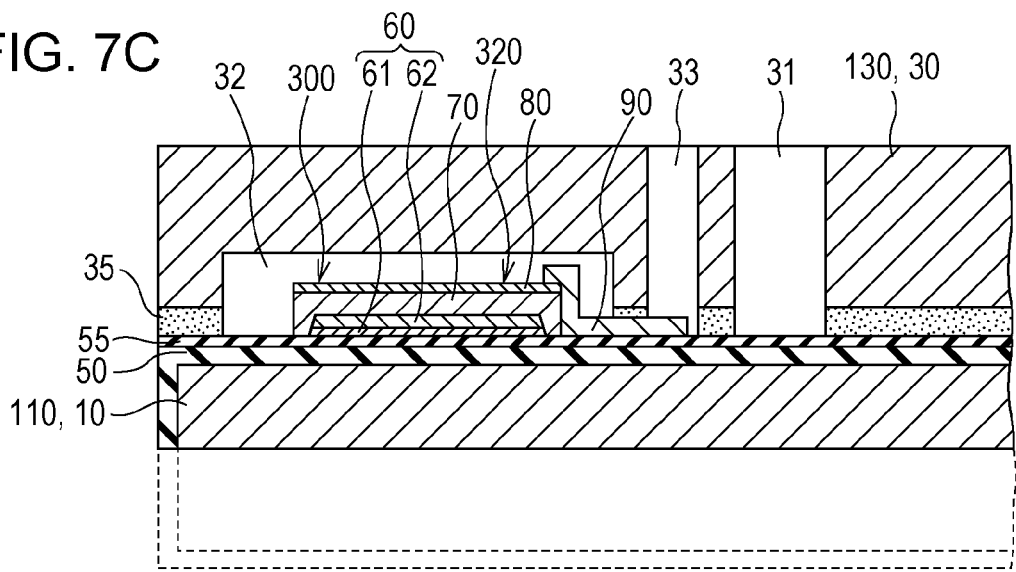

Next, as shown in FIG. 7C, after a protective substrate wafer 130, which is a silicon wafer and serves as a plurality of protective substrates 30, is bonded to a piezoelectric element 300 side of the flow path forming substrate wafer 110 using the adhesive 35, the flow path forming substrate wafer 110 is thinned to a predetermined thickness.

Figure 8A:
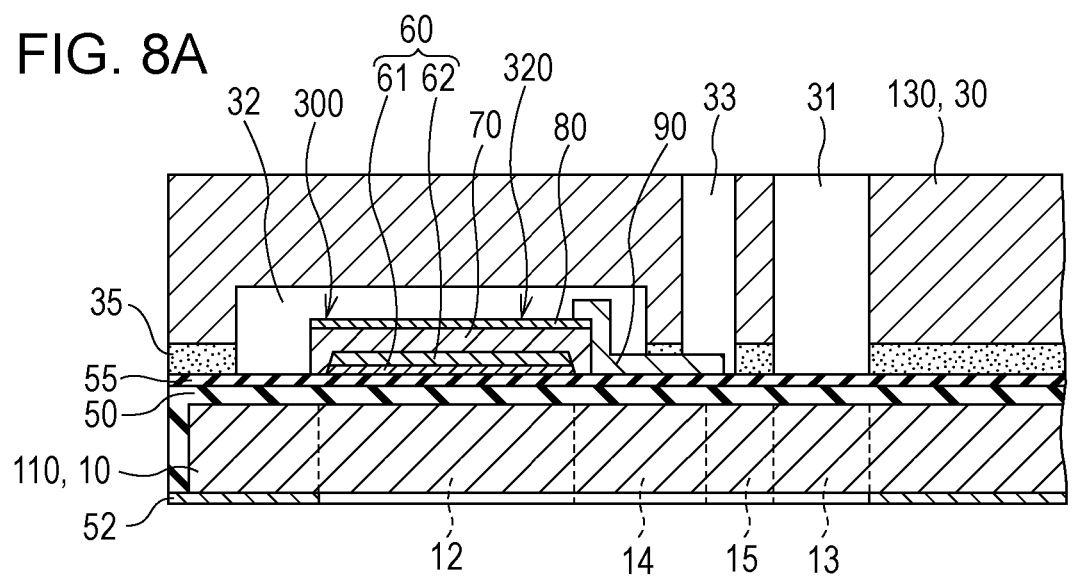
FIGS. 8A and 8B are cross-sectional views that show a manufacturing process of the recording head according to Embodiment 1.

Next, as shown in FIG. 8A, a mask film 52 is newly formed on the flow path forming substrate wafer 110 and is pattered to a predetermined shape.

Figure 8B:
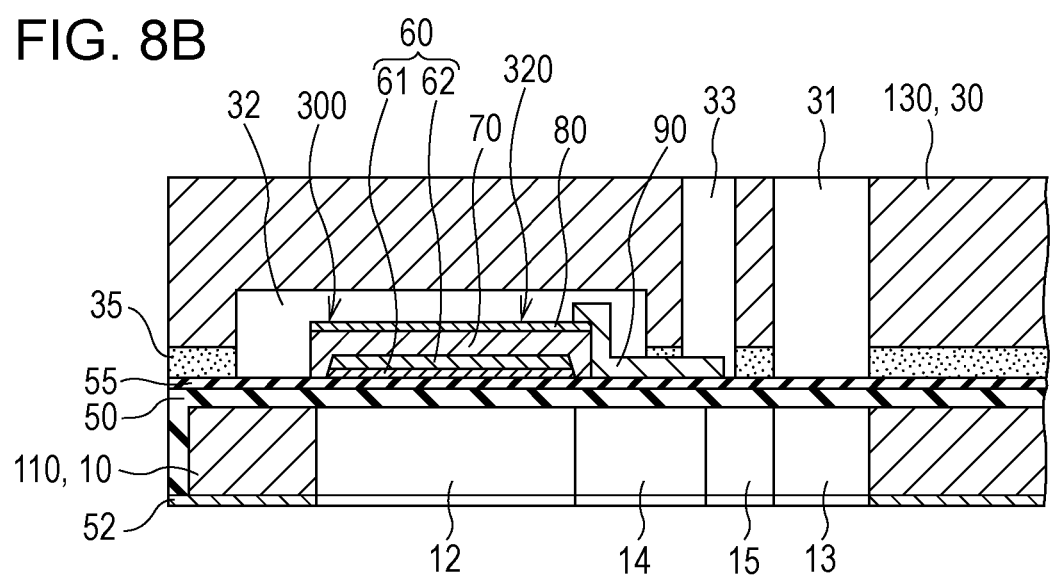

Further, as shown in FIG. 8B, the pressure generation chamber 12, the communication portion 13, the ink supply path 14, the communication path 15 and the like that correspond to the piezoelectric element 300 are formed by performing anisotropic etching (wet etching) of the flow path forming substrate wafer 110 using an alkali solution such as a KOH via the mask film 52.

Subsequently, unnecessary portions of the outer peripheral portions of the flow path forming substrate wafer 110 and the protective substrate wafer 130 are removed using dicing or the like. Further, after removing the mask film on the surface of a side of the flow path forming substrate wafer 110 that is opposite to the protective substrate wafer 130, in addition to bonding the nozzle plate in which the nozzle openings 21 are drilled to the protective substrate wafer 130, the compliance substrate 40 is bonded to the protective substrate wafer 130, and the ink jet type recording head I of the present embodiment is completed by dividing by the flow path forming substrate wafer 110 and the like into flow path forming substrates 10 with a single chip size such as that shown in FIG. 1.

EXAMPLES

Hereinafter, examples will be shown and the invention will be more specifically described. In addition, the invention is not limited to the examples mentioned below.

Example 1

Firstly, a silicon oxide ($SiO_2$) film with a film thickness of 1070 nm was formed on a surface of (100) monocrystalline silicon (Si) substrate using thermal oxidation. Next, a zirconium oxide film (the insulating body layer 55) with a film thickness of 400 nm was formed on the $SiO_2$ film by preparing and thermally oxidizing a zirconium film. Next, a zirconium film with a film thickness of 10 nm was prepared as an adhesive layer using a sputtering method. Next, a platinum film (the wiring layer 61) that is oriented to (111) with a film thickness of 50 nm was prepared on the zirconium film using a sputtering method, and an lanthanum nickel oxide (LNO) film was prepared on the platinum film. In this instance, the method of forming the LNO film (LNO layer 62) is as follows. Firstly, an LNO precursor solution was prepared by mixing lanthanum acetate, nickel acetate and propionic acid at a molar ratio of 1:1, and adjusting to a concentration of 0.3 mol/L with propionic acid after heating and stirring for 1 hour at 140° C. on a hot plate. Next, the LNO precursor solution was filtered and coated onto the abovementioned substrate on which the platinum film is formed using a spin coating method at 2200 rpm, and the LNO film was formed by heating at 750° C. for 5 minutes using RTA after heating at 380° C. for 5 minutes on a hot plate.

Further, the first electrode 60 was prepared by forming a photoresist of a predetermined shape on the LNO film, and patterning the adhesive layer, the platinum film and the LNO film using dry etching.

Next, the piezoelectric body layer 70 was formed on the first electrode 60. The method of forming the piezoelectric body layer 70 is as follows. Firstly, bismuth acetate, iron acetate, manganese acetate, barium acetate and titanium isopropoxide were respectively mixed with 2-ethyl hexanoate, and the mixture was adjusted to a concentration of approximately 0.5 mol/L with 2-ethyl hexanoate and n-octane after heating at 200° C. for 2 minutes. Next, inductively coupled plasma spectroscopy was performed on the adjusted solution, and a precursor solution was adjusted by mixing each element so that the molar ratios are Bi:Fe:Mn:Ba:Ti=60:57:3:20:20 on the basis of ICP spectroscopy concentrations.

Further, the precursor solution was filtered and coated onto the substrate on which the first electrode 60 is formed, and the piezoelectric body precursor film 71 was formed by rotating the substrate at 3000 rpm (the coating process). Next, the substrate was dried at 180° C. for 4 minutes (the drying process), and subsequently degreased at 350° C. for 4 minutes (the degreasing process) on a hot plate. As a result of this, the oxide layer 72 is formed from the piezoelectric body precursor film 71. After repeating a process that includes the coating process, the drying process and the degreasing process twice, the piezoelectric body film 73 was formed from the oxide layer 72 by performing firing in a nitrogen atmosphere that is pressurized at 10 atm at 650° C. for 5 minutes using an RTA device (the firing process). A piezoelectric body layer 70 that is formed from a 12-layer piezoelectric body film 73 was formed by repeating this series of processes six times.

Thereafter, the second electrode 80 is formed by forming an iridium (Ir) film with a film thickness of 50 nm on the piezoelectric body layer 70 using a sputtering method, and patterning the Ir and the piezoelectric body layer 70 using dry etching.

As a result of this, the piezoelectric element 300 in which a composite oxide that has a perovskite structure that includes Bi, Fe, Mn, Ba and Ti serves as the piezoelectric body layer 70 is prepared.

Comparative Example 1

A piezoelectric element was formed with the same sequence as that of the example except that firing was performed in an oxygen atmosphere (1 atm) in the firing process of the oxide layer 72.

Test Example 1

Visual inspection of the example and the comparative example was performed after formation of the first electrode, after formation of the piezoelectric film, after formation of the second electrode and after the preparation of the piezoelectric element. Film rupture and formation abnormalities were not observed after the processes of either example.

Test Example 2

An evaluation of the breakage rates of the example and the comparative example was performed using a dynamic fatigue test. The evaluation of breakage rates was performed using a device that was specifically prepared for the experiment, setting the frequency of an applied waveform to 50 kHz, and using a trapezoid wave with a difference in potential of 45 V. The evaluation did not find any breakage in either piezoelectric element after the application of a $1.9 \times 10^{10}$ pulse. As a result of this, it was understood that initial defects, stress concentrations due to structure or breakages due to mechanical vibrations did not occur in the piezoelectric elements of the example and the comparative example.

Test Example 3

Measurement of current-voltage curves (I-V curves) of the example and the comparative example was performed. The measurement of the I-V curves was performed using "4140B" made by Hewlett Packard Company in atmosphere with the retention time during measurement set as 2 seconds. In addition, measurement was performed by eliminating the influence of photovoltaic power and the like using a light-shielded prober.

Figure 9:
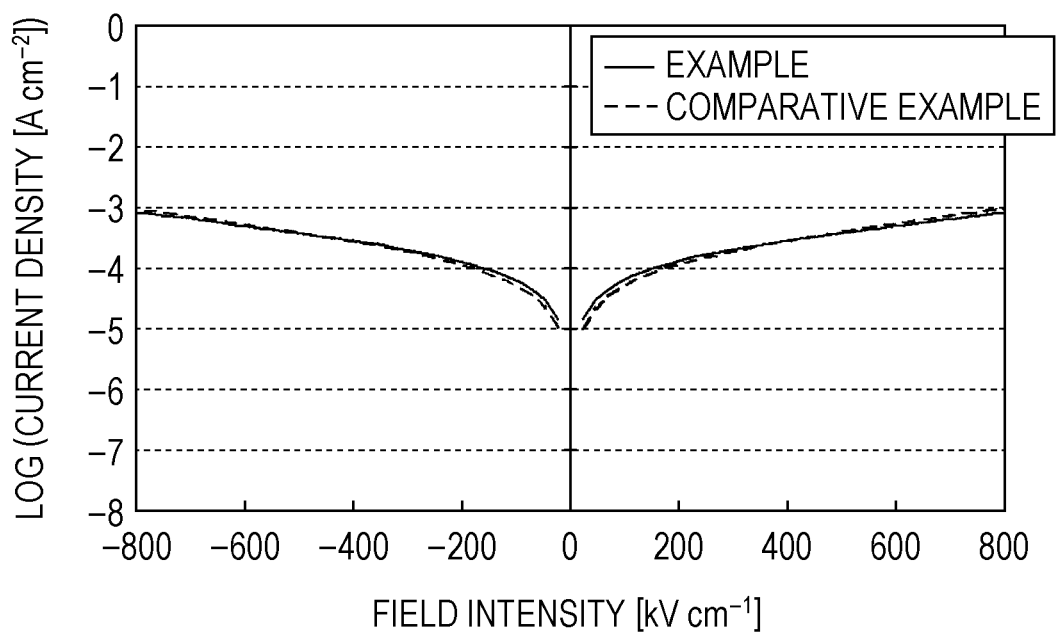
FIG. 9 is a diagram that shows a relationship between the log of current density and field intensity in an example and a comparative example.

FIG. 9 shows an I-V curve. Additionally, in the I-V curve of FIG. 9, the vertical axis is set as the log of current density and the horizontal axis is set as field intensity. As shown in FIG. 9, it was understood that there was no difference in the insulating properties of the piezoelectric elements of the example and the comparative example since the current densities with respect to field intensity in the piezoelectric elements of the example and the comparative example were equivalent.

Test Example 4

Measurement of current density-time curves (I-t curves) of the example and the comparative example was performed. The measurement of the I-t curves was performed using "4140B" made by Hewlett Packard Company in atmosphere with the measurement temperature set as 75° C. Temperature control was performed using a hot plate with an allowable temperature range set as ±1° C. or less. In addition, measurement was performed by eliminating the influence of photovoltaic power and the like using a light-shielded prober.

Figure 10A:
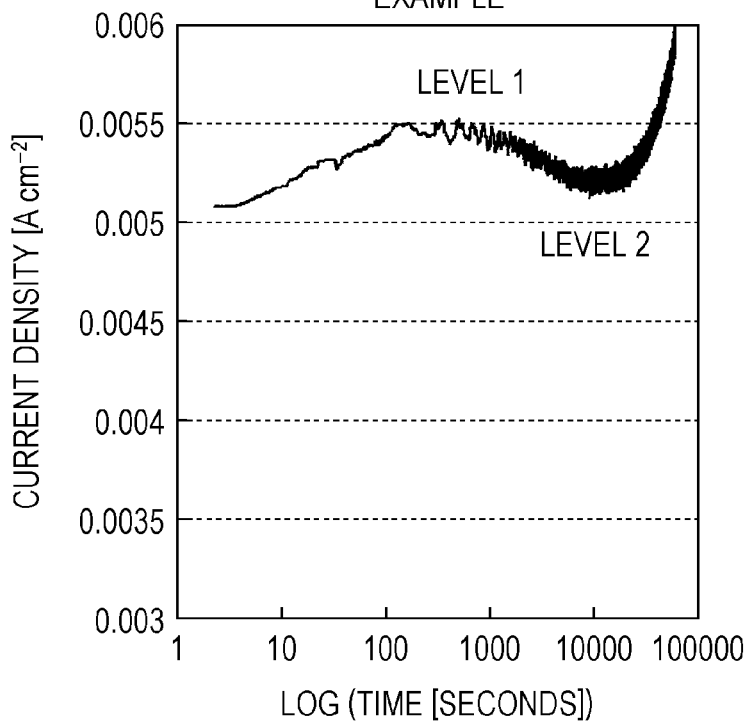
FIGS. 10A and 10B are diagrams that show relationships between current density and the log of time in an example and a comparative example.
Figure 10B:
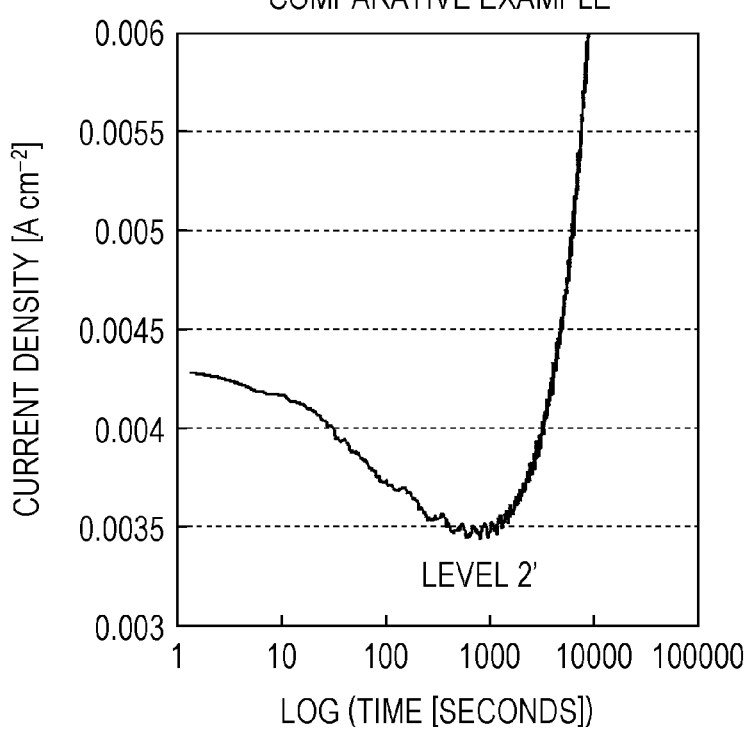

FIG. 10A shows an I-t curve of the example, and FIG. 10B shows an I-t curve of the comparative example. As shown in FIG. 10A, in the piezoelectric element of the example, an increase in the amount of a current that accompanies the passage of time is observed initially, then an inflection point (the level 1) that changes to a decrease after the amount of a current has increased to a maximum, and an inflection point (the level 2) that changes to an increase after the amount of the current has further decreased to a minimum with the passage of time are observed.

On the other hand, as shown in FIG. 10B, in the piezoelectric element of the comparative example, a decrease in the amount of a current that accompanies the passage of time is initially observed, then an inflection point (the level 2') that changes to an increase after the amount of the current has decreased to a minimum is observed. The increase in the amount of the current occurs initially in the example in this manner because impurities with a small carrier density (level of electron density) are introduced into the piezoelectric body layer 70 by performing firing of the oxide layer 72 in a pressurized nitrogen atmosphere, and the impurity level (subband) is incorporated in the current density-time curve of the piezoelectric body layer 70. On the other hand, in the comparative example in which the firing of the oxide layer 72 is performed in an oxygen atmosphere, since an initial increase in the amount of the current was not caused, it was understood that impurities with a small carrier concentration were not introduced into the piezoelectric body layer.

Figure 11:
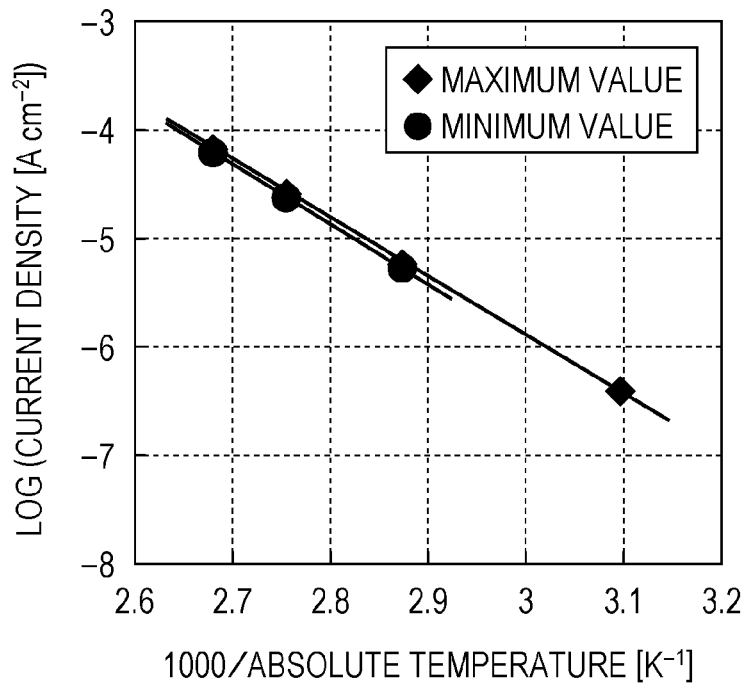
FIG. 11 is a diagram that shows an Arrhenius plot of maximum values and minimum values of current density in an example.

In addition, FIG. 11 shows an Arrhenius plot of maximum values and minimum values of current density in the example. As shown in FIG. 11, it was understood that the inclination in the Arrhenius plot of maximum values and minimum values of current density, that is, the activation energies of the level 1 and the level 2, are equivalent.

Figure 12:
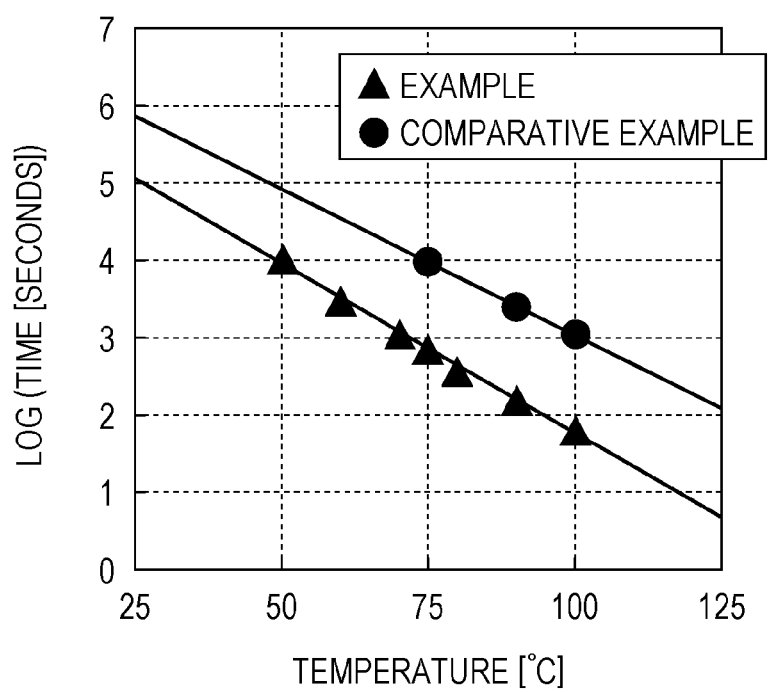
FIG. 12 is a diagram that shows a relationship between the log of relaxation time and temperature in an example and a comparative example.

In addition, FIG. 12 shows a relationship between the log of relaxation time and temperature in the example and the comparative example. As shown in FIG. 12, it was understood that the log of relaxation time has a linear relationship with temperature, and that the relaxation time of the example at each temperature had a relationship of 10-fold time acceleration with the relaxation time of the comparative example. For example, if the relaxation times at room temperature (25° C.) is calculated, the example has a relaxation time of 205 hours and the comparative example has a relaxation time of 31 hours, and therefore, it was understood that the relaxation time of the example was approximately 6.6 times longer.

Test Example 5

Figure 13:
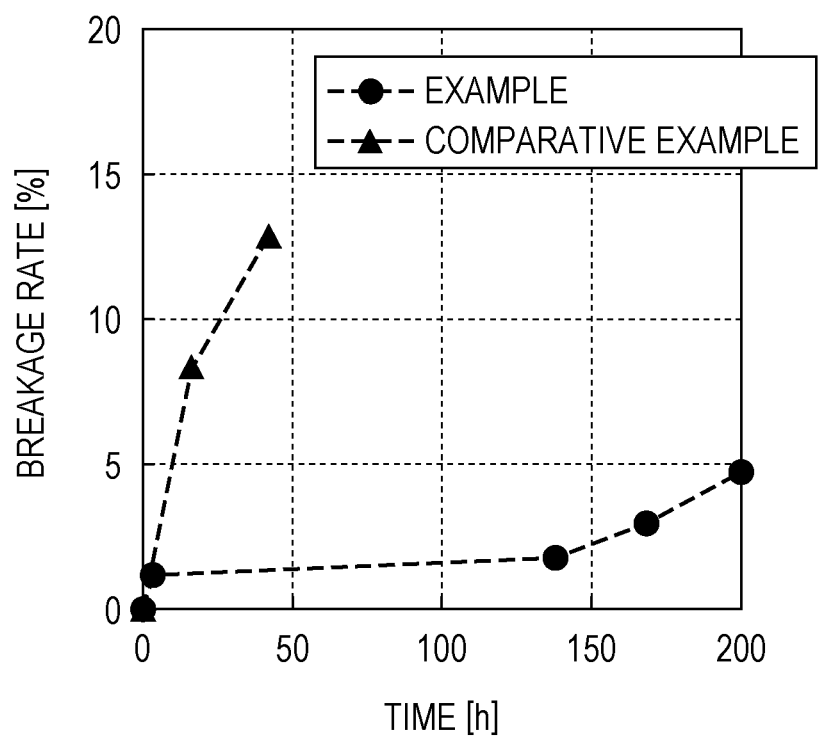
FIG. 13 is a diagram that shows a relationship between breakage rate and time in an example and a comparative example.

Time-dependent dielectric breakdown (TDDB) evaluation of the example and the comparative example was performed. The TDDB evaluation was performed using a device that was specifically prepared for the experiment, and setting the DC voltage to 45 V. FIG. 13 shows a relationship between breakage rates and time in the example and the comparative example. As shown in FIG. 13, it was understood that while the breakage rate of the piezoelectric element of the example after 200 hours was 5% or less, the breakage rate of the piezoelectric element of the comparative example after 16 hours was 8% and rose to 13% after 42 hours.

Summary of Results

From the I-t curves of FIGS. 10A and 10B, it was clear that the main levels that contribute to conduction in the example and the comparative example were the levels (level 2 and level 2') that correspond to minimums. Furthermore, since the current densities (the amount of the current) of the I-V curves in FIG. 9 are equivalent, and the activation energies at the maximums and the minimums of current density in the example in FIG. 11 are equivalent, it was understood that the potential energy and carrier density of the level 2 and the level 2' were equivalent.

On the other hand, in the maximum (the level 1) that was only observed in the I-t curve of the example, the activation energy was equivalent to the level 2, but the increase in the amount of the current was smaller by less than or equal to 7%. As a result of this, it was understood that the level 1 is an impurity level that is caused by impurities with a small carrier concentration (level of electron density) that are introduced into the piezoelectric body layer 70 in the pressurized nitrogen atmosphere in the firing step of the oxide layer 72, and that the excitation time of the impurities with a small carrier concentration is extremely slow in comparison with the dielectric relaxation time. From this, it was clear that the excitation of the impurities with a small carrier concentration competes with dielectric relaxation, and that it is possible to make the dielectric relaxation time of the piezoelectric body layer of the example longer.

Furthermore, the results of TDDB evaluation in FIG. 13 showed that in the example that has a long dielectric relaxation time, the breakage rate was 5% or less at 200 hours, where that of the comparative example was 13% at 42 hours. In this instance, in the dynamic fatigue test of Test Example 2, since breakage was not observed in either the piezoelectric element of the example or the comparative example, it was understood that the breakage that was confirmed by TDDB evaluation was a breakage mode that was specific to DC voltage. As a result of this, it was understood that the piezoelectric element of the example has a superior breakage resistance property to DC voltage.

In addition, since the abovementioned increase in the amount of the current with respect to time that is seen in the I-t curves of FIGS. 10A and 10B is derived from breakage of a property as a dielectric body, even if the insulating properties are equivalent, it is possible to slow down the time to breakage by making the dielectric relaxation time longer. According to the invention, it is possible to realize a liquid ejecting head including a piezoelectric element that can make dielectric relaxation time longer and reduce the breakage rate due to DC voltage by incorporating the level 1, the activation energy of which is close to that of the main level 2 that contributes to conduction, and which is excited by direct current conduction, or in other words, that can improve the breakage resistance property to DC voltage without a dramatic improvement in insulating property, a liquid ejecting apparatus and a piezoelectric element.

OTHER EMBODIMENTS

Each embodiment of the invention has been described above, but the basic configuration of the invention is not limited to the descriptions mentioned above.

In addition, in Embodiment 1 mentioned above, a configuration in which the piezoelectric body layer 70 of each active portion 310 is continuously provided, is shown as an example, but naturally, a configuration in which the piezoelectric body layer 70 is provided separately for each active portion 310 may also be used.

In Embodiment 1 mentioned above, a liquid ejecting head in which the first electrode 60 configures individual electrodes that are provided separately with respect to the pressure generation chambers 12, and the second electrode 80 configures a common electrode that is provided continuously across an entire parallel arrangement direction of the pressure generation chambers 12 is shown as an example, but a configuration in which the first electrode 60 configures a common electrode that is provided continuously across an entire parallel arrangement direction of the pressure generation chambers 12, and the second electrode 80 configures individual electrodes that are provided separately with respect to the pressure generation chambers 12, may also be used.

Figure 14:
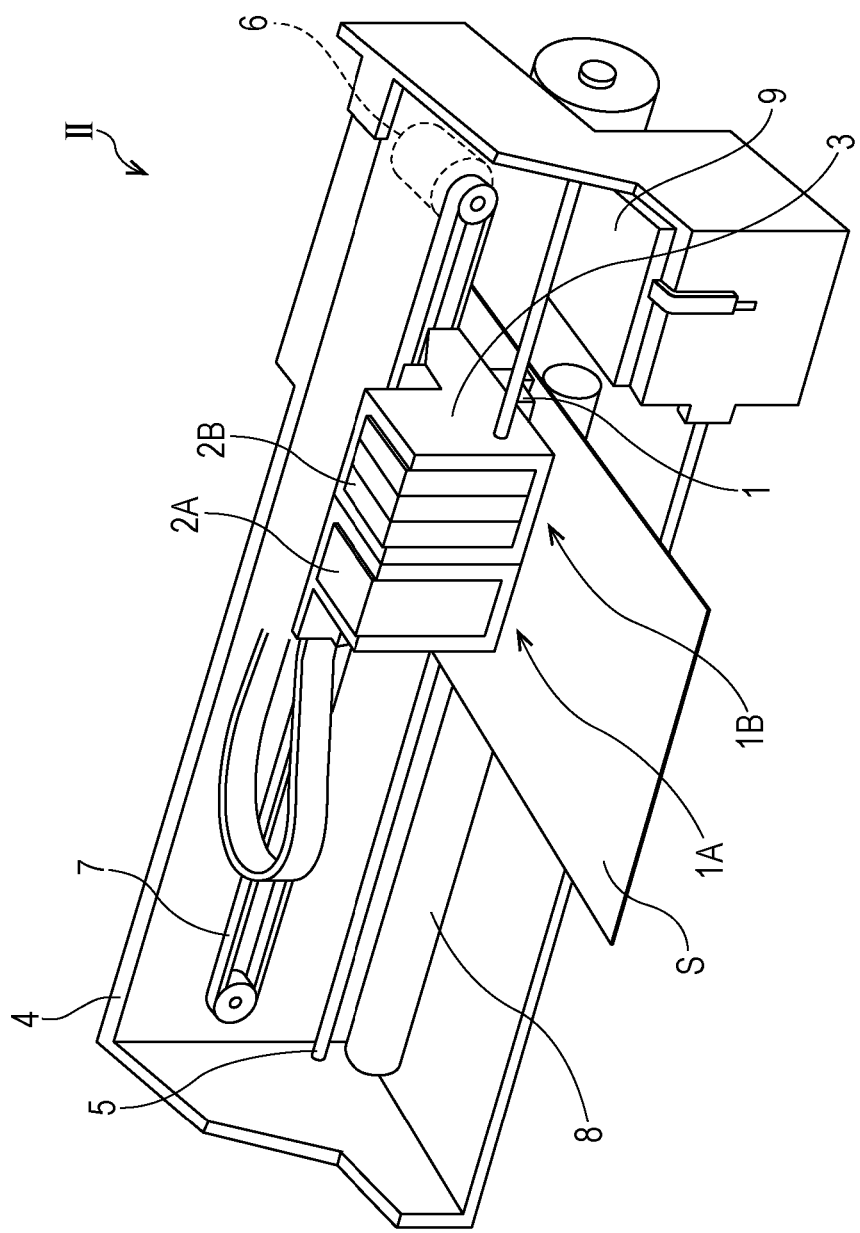
FIG. 14 is a diagram that shows a schematic configuration of a recording apparatus according to an embodiment of the invention.

In addition, as shown in FIG. 14, the ink jet type recording head I (refer to FIG. 1) is for example, installed in an ink jet type recording apparatus II. Cartridges 2A and 2B that configure ink supply means are provided in an attachable and detachable manner in recording head units 1A and 1B that have the ink jet type recording head I, and a carriage 3 in which the recording head units 1A and 1B are installed, is provided in a carriage shaft 5 that is attached to a device main body 4 in a manner that is movable in an axial direction. The recording head units 1A and 1B, for example, discharge a black ink composition and a color ink composition.

Further, by transmitting a driving force of a drive motor 6 to the carriage 3 via a plurality of gear wheels (not shown in the drawings) and a timing belt 7, the carriage 3 in which the recording head units 1A and 1B are installed moves along the carriage shaft 5. Meanwhile, a transport roller 8 is provided in the device main body 4 as transport means, and recording sheets S, which are a recording medium such as a paper, are transported by the transport roller 8. Additionally, the transport means that transports the recording sheets S is not limited to a transport roller, and may be a belt, a drum or the like.

Additionally, the abovementioned example, as an ink jet type recording apparatus II, an ink jet type recording apparatus in which the ink jet type recording head I is installed in a carriage 3 and which moves in a main scanning direction is shown as an example, the configuration thereof is not particularly limited. For example, an ink jet type recording apparatus II may also be a so-called line type recording apparatus in which the ink jet type recording head I is fixed, and which performs printing by moving recording sheets S such as paper in a sub-scanning direction.

In addition, in the abovementioned embodiment, an ink jet type recording head was described as an example of the liquid ejecting head, but the invention can be widely applied to general liquid ejecting heads, and naturally, can be applied to a liquid ejecting heads that ejects liquids other than ink. Examples of other liquid ejecting heads include various recording heads that are used in image recording apparatuses such as printers, color material ejecting heads that are used in the production of color filters such as liquid crystal displays, electrode material ejecting heads that are used in electrode formation such as organic EL displays, Field Emission Displays (FED) and the like, and living organic material ejecting heads that are used in the production of biochips.

In addition, since the piezoelectric body layer 70 according to the invention has favorable ferroelectric characteristics, it is possible to use the piezoelectric body layer 70 suitably in ferroelectric elements. Ferroelectric memory (FeRAM), ferroelectric transistors (FeFET), ferroelectric arithmetic circuits (FeLogic), ferroelectric capacitors and the like can be included as examples of ferroelectric elements in which the piezoelectric body layer 70 can be suitably applied.

In addition, since the piezoelectric body layer 70 according to the invention has favorable piezoelectric characteristics, it is possible to use the piezoelectric body layer 70 suitably in piezoelectric elements. Liquid ejecting apparatuses, ultrasonic motors, piezoelectric transformers, vibration type dust removal apparatuses, pressure-electricity converters, ultrasonic communicators, ultrasonic detectors, pressure sensors, acceleration sensors and the like can be included as examples of piezoelectric elements in which the piezoelectric body layer 70 can be suitably applied.

In addition, since the piezoelectric body layer 70 according to the invention has favorable pyroelectric characteristics, it is possible to use the piezoelectric body layer 70 suitably in pyroelectric devices. Heat-electricity converters, infrared detectors, terahertz detectors, temperature sensors, and thermosensitive sensors and the like can be included as examples of pyroelectric elements in which the piezoelectric body layer 70 can be suitably applied.

Furthermore, since the piezoelectric body layer 70 according to the invention has favorable flat surfaces and a high dielectric constant, it is possible to use the piezoelectric body layer 70 suitably in optical elements. Wavelength converters, optical waveguides, shielding filters of harmful rays such as infrared rays, optical filters that use a photonic crystal effect due to quantum dot formation, optical filters that use the optical interference of thin films, light-heat conversion filters that use specific pattern structures and the like can be included as examples of optical elements in which the piezoelectric body layer 70 can be suitably applied.

Furthermore, since the piezoelectric body layer 70 according to the invention has a favorable activation energy-electricity conversion capacity, it is possible to use the piezoelectric body layer 70 suitably in electricity generation elements. Electricity generation elements that use a pressure-electricity conversion effect, electricity generation elements that use electronic excitation due to light (photovoltaic power), electricity generation elements that use electronic excitation due to heat (thermoelectromotive force), electricity generation elements that use vibrations and the like can be included as examples of electricity generation elements in which the piezoelectric body layer 70 can be suitably applied.

The entire disclosure of Japanese Patent Application No. 2013-242389, filed Nov. 22, 2013 is expressly incorporated by reference herein.

What is claimed is:

1. A piezoelectric element comprising:
    a first electrode;
    a second electrode; and
    a piezoelectric body layer between the first electrode and the second electrode, the piezoelectric body layer including 50 mol % or more of at least bismuth and iron, and the piezoelectric body layer having a current density-time curve obtained by applying a voltage to the first electrode and the second electrode including a plurality of inflection points.

2. The piezoelectric element according to claim 1,
    wherein, one of the plurality of inflection points is convex upwards with respect to an absolute value of an amount of a current.

3. The piezoelectric element according to claim 1,
    wherein, one of the plurality of inflection points is convex downwards with respect to an absolute value of an amount of a current.

4. The piezoelectric element according to claim 1,
    wherein, the plurality of inflection points includes a first inflection point which is convex upwards with respect to an absolute value of an amount of a current and a second inflection point which is convex downwards with respect to an absolute value of an amount of a current.

5. The piezoelectric element according to claim 4,
    wherein, an absolute value of an amount of a current at the first inflection point is greater than or equal to an absolute value of an amount of a current at the second inflection point.

6. The piezoelectric element according to claim 1,
    wherein the piezoelectric body layer is formed by firing films including at least bismuth and iron, in a nitrogen atmosphere.

7. The piezoelectric element according to claim 1,
    wherein the piezoelectric body layer further includes barium and titanium.

8. The piezoelectric element according to claim 1,
    wherein the piezoelectric body layer further includes manganese.

9. A liquid ejecting head comprising the piezoelectric element according to claim 1.

10. A liquid ejecting apparatus comprising the liquid ejecting head according to claim 9.

11. The piezoelectric element according to claim 1, wherein the piezoelectric body layer is formed by firing films including at least bismuth and iron, in a pressurized nitrogen atmosphere.

* * * * *